United States Patent
Aksoy et al.

(10) Patent No.: US 7,348,776 B1
(45) Date of Patent: Mar. 25, 2008

(54) MOTION CORRECTED MAGNETIC RESONANCE IMAGING

(75) Inventors: Murat Aksoy, Stanford, CA (US);
Chunlei Liu, Fremont, CA (US);
Rexford Newbould, Menlo Park, CA (US); Roland Bammer, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/469,617

(22) Filed: Sep. 1, 2006

(51) Int. Cl.
*G01V 3/00* (2006.01)
(52) U.S. Cl. ...................................... 324/307
(58) Field of Classification Search ........ 324/300–322; 600/410–435; 382/128, 130–132, 254–255, 382/275, 280, 282–283, 293–301
See application file for complete search history.

(56) References Cited

U.S. PATENT DOCUMENTS

| | | | | |
|---|---|---|---|---|
| 5,558,091 A | * | 9/1996 | Acker et al. | 600/424 |
| 5,833,608 A | * | 11/1998 | Acker | 600/409 |
| 5,850,486 A | * | 12/1998 | Maas et al. | 382/294 |
| 6,178,271 B1 | * | 1/2001 | Maas, III | 382/294 |
| 6,373,970 B1 | * | 4/2002 | Dong et al. | 382/128 |
| 6,427,314 B1 | * | 8/2002 | Acker | 29/593 |
| 6,549,607 B1 | * | 4/2003 | Webber | 378/8 |
| 6,724,190 B2 | * | 4/2004 | van Muiswinkel et al. | 324/307 |
| 6,801,597 B2 | * | 10/2004 | Webber | 378/62 |
| 6,950,543 B2 | * | 9/2005 | King et al. | 382/128 |
| 7,071,689 B2 | * | 7/2006 | Golay et al. | 324/309 |
| 7,197,353 B2 | * | 3/2007 | King et al. | 600/410 |

OTHER PUBLICATIONS

Bammer et al., "An Apparatus to Perform Motion Corrected Magnetic Resonance Imaging", Invention Disclosure (unpublished), 3 pages.
Aksoy et al., "A Self-Navigated Spiral In & Out Pulse Sequence Design for Retrospective Motion Correction", ISMRM 14th Scientific Meeting and Exhibition, May 6-12, 2006, Seattle, Washington, USA, 6 pages.

* cited by examiner

*Primary Examiner*—Brij Shrivastav
*Assistant Examiner*—Dixomara Vargas
(74) *Attorney, Agent, or Firm*—Beyer Weaver LLP

(57) ABSTRACT

A method of correcting for motion in magnetic resonance images of an object detected by a plurality of signal receiver coils comprising the steps of acquiring a plurality of image signals with the plurality of receiver coils, determining motion between sequential image signals relative to a reference, applying rotation and translation to image signals to align image signals with the reference, determining altered coil sensitivities due to object movement during image signal acquisition, and employing parallel imaging reconstruction of the rotated and translated image signals using the altered coil sensitivities in order to compensate for undersampling in k-space.

6 Claims, 7 Drawing Sheets a b

MOTION CORRECTED MAGNETIC RESONANCE IMAGING

STATEMENT REGARDING FEDERALLY SPONSORED RESEARCH OR DEVELOPMENT

The U.S. government has rights in the claimed invention pursuant to NIH Grant Nos. NIH-1R0EB002771, NIH-1R0NS35959, NIH-NCRR-P41-RR09784, 1R0NS047607 and 5R01NS34866 to Stanford University.

BACKGROUND OF THE INVENTION

This invention relates generally to magnetic resonance imaging (MRI), and more particularly the invention relates to the correction of magnetic resonance imaging for motion of the imaged body.

Involuntary patient motion is still one of the greatest challenges in MRI. Due to the sequential nature of the MR acquisition process, a significant amount of time can elapse between different samples in k-space, leaving many MRI sequences vulnerable to patient motion. The resulting increase in misregistration can severely impair the diagnostic quality of an MR examination. The medical condition of a patient, such as tremor, pain, or mental status, often prevents even willing patients from holding still. Past attempts at addressing this problem through sequence approaches, such as snapshot imaging or gated acquisition, have had limited success. Therefore, efficient motion correction strategies are timely and have the potential for great impact as MRI becomes more common in geriatric and pediatric patient populations.

SUMMARY OF THE INVENTION

The invention is a novel apparatus and method that can acquire motion-corrected 2D and 3D Magnetic Resonance Images (MRI). This invention contributes to improved scan robustness in restless patients or during long MRI scans where motion cannot be avoided (e.g. volumetric 3D MRI & PC-MRAs, FMRI, DTI). Specifically, the method performs a retrospective motion correction by capitalizing on new motion detection techniques and augmented parallel imaging methodology.

Prior art has described the effect of motion in k-space, but not in the context of multi-coil data and its effect on the final image. Moreover, parallel imaging has been used to correct for corrupted k-space samples but thus far it was not realized how 1) missing data can be synthesized by iterative reconstructions, and how 2) coil sensitivity changes have to be considered in the reconstruction. Prospective motion correction has been introduced in prior art but based on MRI measurements; no motion capture devices were used. The invention allows one to significantly diminish k-space fragmentation by means of parallel imaging reconstruction and, hence, to reduce motion artifacts in the final image. A comprehensive formalism is provided that characterizes k-space information relative to receiver coil sensitivities in the presence of motion.

Specifically, this invention can be separated into three parts: First, the determination of motion between subsequent k-space profiles/interleaves relative to a reference point, for example, using navigator images. Second, the application of counter rotation/translation to align each profile/interleave with the reference point. Third, the performance of an augmented parallel imaging reconstruction to avoid local undersampling and variable sampling density as well as to address coil sensitivity alterations induced by motion within the coil sensitivity field.

1.) Prior art in retrospective motion correction often suffers from partially undersampled k-space after being corrected for motion. Thus, the resulting images are often frustrated by ghosting artifacts and signal loss. 2.) Prospective motion correction based on MRI navigator images/volumes suffer from time delays since motion parameters need to be extracted from at least two images/volumes and can only be applied to the third acquisition after considerable time lag and after completion of k-space acquisition of the entire slice/volume to maintain consistency. The present method has very little time lag and can be applied almost in real time. 3.) The residual k-space inconsistencies due to residual motion and data acquisition under variable coil sensitivity (due to motion) can be corrected for by the aforementioned parallel imaging approach.

For the first part of the invention, motion can be detected by intrinsic navigator images (e.g. low resolution spiral). Specifically, the degree of misalignment relative to a reference point (e.g. reference image) can be detected by co-registering each navigator image to the reference image. Alternatively, motion can be detected via external fiducials (mounted on the subject) and motion capture devices, for example, optical systems.

For the second point, translational and rotational motion is reflected in k-space by linear phase rolls and rotations, respectively. Hence, corresponding interleaves need to be counter-rotated and phased appropriately. This can be done best during gridding by rotating the input gridding trajectory and phase modulating the acquired k-space data.

For the third part, an image reconstruction algorithm is used that considers the altered coil sensitivity to which an object is exposed to if it moves during MRI image acquisition. Note that the effect of altered coil sensitivity needs to be considered regardless of using either prospective or retrospective motion correction techniques or whether or not parallel imaging based scan acceleration is used. For the case of retrospective motion correction, the k-space might appear fragmented and partially under- or oversampled. Here, both augmented parallel imaging reconstruction (e.g. iterative SENSE reconstruction) and sampling density correction algorithms will be applied to diminish these artifacts.

The invention and object and features thereof will be more readily apparent from the following detailed description and appended claims when taken with the drawings.

DETAILED DESCRIPTION OF ILLUSTRATIVE EMBODIMENTS

As noted above, the application of conventional motion correction strategies often produces undersampled k-space data. As a result, significant residual artifacts can persist. The present invention introduces a variant of parallel imaging that reduces the net k-space undersampling and improves overall image quality. This correction scheme employs an iterative image reconstruction to synthesize missing data in k-space and exploits the complementary image encoding capacity provided by parallel imaging.

In this implementation, motion is determined from low resolution navigator images that are co-registered by an automatic registration routine. Navigator data can be derived from self-navigating k-space trajectories or in combination with other navigation schemes that estimate patient motion.

In applying motion correction in accordance with the invention, several assumptions are made including only translation and rotation of rigid body motion is present and negligible motions occurs during data acquisition.

Figure 1:
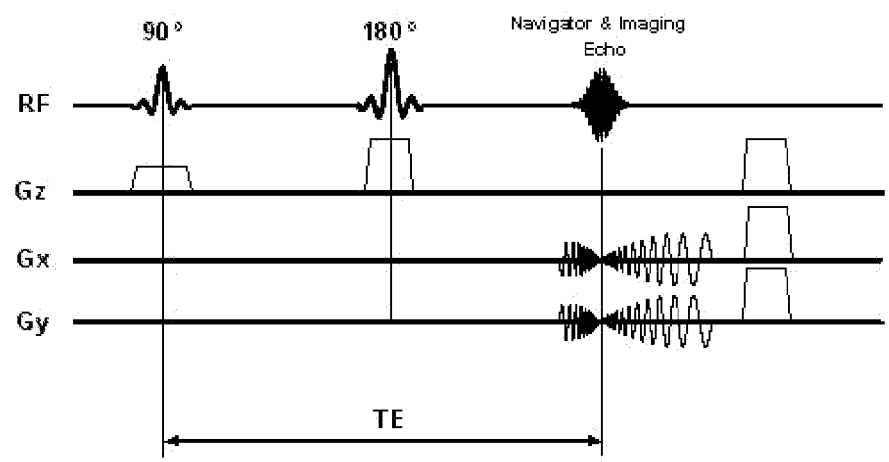
FIG. 1 illustrates a spiral in and spiral out pulse sequence showing one interleaf of image acquisition and a low resolution navigator image for the interleaf.

FIG. 1 illustrates a spiral in/spiral out pulse sequence which can be used to determine the extent of motion from an appropriate set of navigator images. A modified SENSE reconstruction procedure uses the navigator data to find motion parameters and eliminates the effects of undersampling k-space.

Due to the gradient system limitations, a spiral trajectory mostly starts off in slew rate limited region and switches to amplitude limited region after a certain time which is determined by the scan parameters. In the case of the spiral in & out trajectory used for this study, a spiral in trajectory is used to get a fully sampled low resolution image for each interleave, and the spiral out part constitutes one of the interleaves of the final high resolution image (FIG. 1). One advantage of this pulse sequence is that the spiral in portion makes use of the dead time after the 180° degree pulse up to the echo time TE and this introduces no penalty for scan time in case of T2 weighting. The matrix size of the low resolution navigator data can be adjusted interactively before scan by the operator.

The way in which motion affects the final image depends upon the magnitude and direction of the motion as well as its temporal relation to the acquisition of k-space. Overall, the net effect of patient motion during MR imaging is k-space data inconsistency, which produces artifacts in the final image. If one can identify corrupted k-space data and has knowledge of the degree of motion, it is possible to correct, or at least to reduce, image artifacts by i) rejecting corrupted k-space data; ii) reacquiring corrupted k-space data; iii) applying retrospective correction schemes that undo the effects of motion; or iv) determining motion on-the-fly and prospectively adjusting the acquisition for the new location of interest while scanning.

The simplest form of motion is rigid-body translation without elastic deformation. In k-space, translational motion is manifested by a linear phase shift along the direction of motion. Rotational motion produces a slightly more complicated artifact pattern. For a given object, a rotation in image space produces the same rotation in k-space. Therefore, during sequential scanning, the expected k-space information at a particular position will have been rotated away and will be partially missing or replaced by data that have already been acquired. Consequently, these object rotations can be the source of significant image artifacts.

Figure 2:
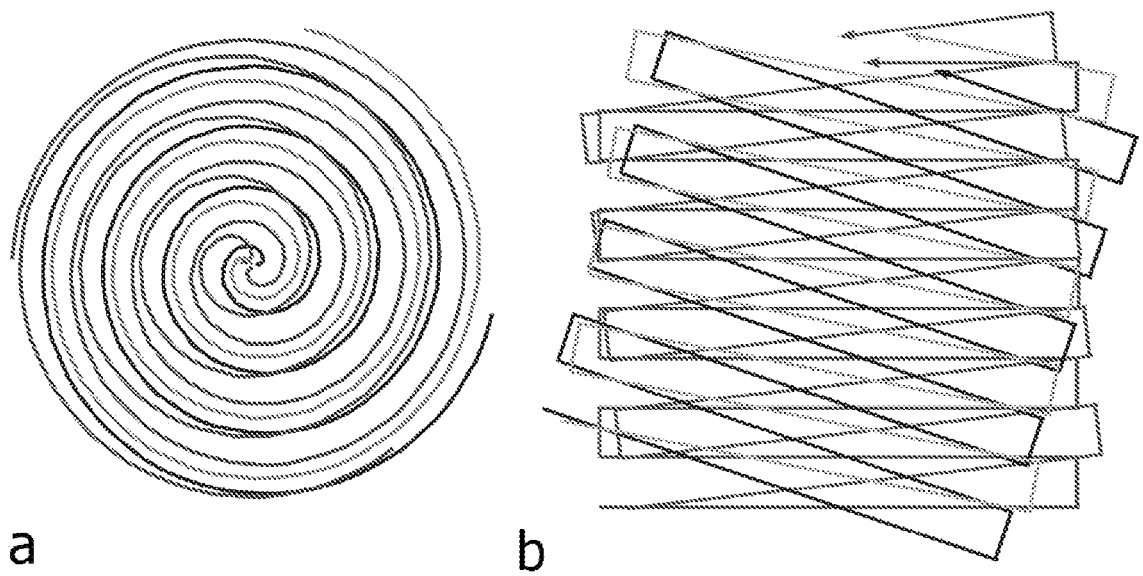
FIG. 2 illustrates interleaved spirals (a) and interleaved EPI (b) showing rotation effects.

In order to correct for rotational motion artifacts, one needs to synchronize the trajectory and the acquired k-space data with the rotated object. Specifically, the misaligned k-space lines, or interleaves, can be counter-rotated relative to a reference point. However, the rotation procedure usually puts the corrected k-space data at locations that no longer coincide with an equidistant Cartesian grid, resulting in local under-sampling and ill-conditioning of the reconstruction problem (FIG. 2). The effects of rotation are corrected by counter-rotating the individual interleaves. The effect of this counter-rotation on the k-space trajectories is shown for both interleaved spirals (a) and interleaved EPI (b). It is clearly apparent that the counter-rotation causes a variable sampling density in various areas of k-space. Some regions become oversampled compared to the Nyquist sampling rate whereas other regions become only sparsely sampled. For the EPI, it is also worthwhile noticing that the sampled trajectory data are no longer on an equidistant grid. Therefore, interpolation methods for image reconstruction that address the ill-conditioning have been proposed. A novel motion correction approach is presented that avoids some of the aforementioned problems and improves the conditioning of the reconstruction by first putting the motion problem into a matrix formalism and then using a parallel-imaging-based synthesis of the missing k-space information.

Parallel imaging was introduced several years ago as a complement to conventional gradient encoding. Since then, it has been employed in a broad spectrum of applications ranging from rapid imaging to the reduction of image artifacts. The inhomogeneous RF profiles of individual receiver coils can be used to synthesize missing information in k-space or to remove aliasing. The method proposed here retrospectively corrects rigid body rotation and translation as well as compensates for the resulting variable density sampling pattern. Specifically, the method utilizes an augmented iterative parallel imaging reconstruction approach to correct for motion regardless of the type of trajectory being used. The proposed correction method was tested with a new variant of spiral navigators that can be incorporated in various pulse sequences.

Figure 3:
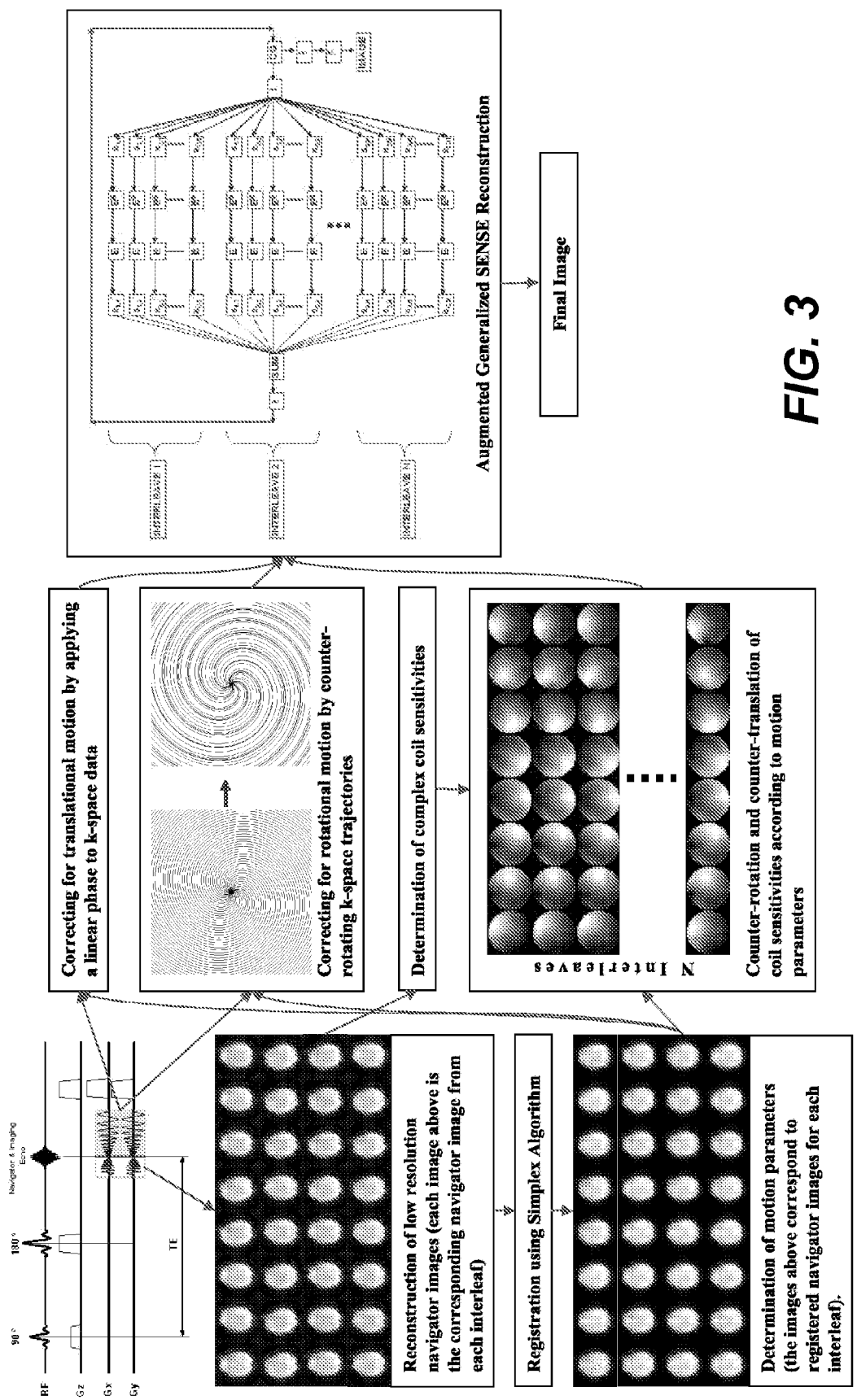
FIG. 3 is a flow diagram of the algorithm for producing motion corrected images in accordance with an embodiment of the invention.

The invention retrospectively corrects rigid body rotation and translation and compensates for the resulting variable density sampling pattern. Specifically, the method utilizes an augmented iterative parallel imaging reconstruction approach to correct for motion regardless of the type of trajectory being used. This is illustrated in the flow diagram of FIG. 3 of the motion correction algorithm.

In the flow diagram, the low resolution navigator images from the pulse sequence are obtained for each k-space interleaf. Registration of the navigators using Simplex Algorithm determines motion parameters. Optimization routines other than Simplex can be used as well.

Translational motion is corrected by applying a linear phase to k-space data, and rotational motion is corrected by counter-rotating k-space trajectories.

Complex coil sensitivities are determined, and counter-rotation and counter-translation of coil sensitivities are made according to the motion parameters.

The corrected k-space interleaves are then processed in parallel using a generalized SENSE (GSENSE) reconstruction. The final image results from the parallel imaging reconstruction for arbitrary k-space data that considers coil sensitivity variations during data acquired along with motion corrected k-space image data.

Consider now the theory for augmented GSENSE reconstruction for motion correction. For a better understanding of how motion affects k-space and, thus, the reconstructed image, we will first describe the formation of an MRI data sample at a particular point in time, $t_i$ (i=1 ... K), using discrete sampling in the time and spatial domain, $r_u$ (u=1 ... $N^2$):

$$m(t_i) = \sum_{u=1}^{N \times N} \rho(r_u) \exp(-jk(t_i) \cdot r_u). \quad [1]$$

Therefore, the entire acquisition of $\kappa$ k-space points can be stored in a measurement vector, $m=[m(t_1)\ m(t_2) \ldots m(t_\kappa)]^T$, so that the signal formation in matrix form can be expressed as:

$$\begin{pmatrix} m(t_1) \\ m(t_2) \\ \vdots \\ m(t_\kappa) \end{pmatrix} = \begin{pmatrix} e^{-jk_1 r_1} & e^{-jk_1 r_2} & \ldots & e^{-jk_1 r_{N^2}} \\ e^{-jk_2 r_1} & e^{-jk_2 r_2} & \ldots & e^{-jk_2 r_{N^2}} \\ \vdots & \vdots & \ddots & \vdots \\ e^{-jk_\kappa r_1} & e^{-jk_\kappa r_2} & \ldots & e^{-jk_\kappa r_{N^2}} \end{pmatrix} \begin{pmatrix} \rho(r_1) \\ \rho(r_2) \\ \vdots \\ \rho(r_{N^2}) \end{pmatrix} = m = Ev, \quad [2]$$

where, $v=[\rho(r_1)\ \rho(r_2) \ldots \rho(r_{N^2})]^T$ is the spatial signal distribution in vector form; $k_i=[k_x(t_i)k_y(t_i)k_z(t_i)]^T|_{i=1\ldots\kappa}$ is an arbitrary k-space sampling trajectory; and $r_u=[r_{x,u}r_{y,u}r_{z,u}]^T|_{u=1\ldots N\times N}$ is the position vector. The solution vector v for the image signal distribution can then be obtained by computing the Moore-Penrose inverse of E, $$E^+ m = v = (E^H E)^{-1} E^H m. \quad [3]$$

The encoding matrix E can be replaced by the matrix product GF so that Eq 2 becomes $$m = GFv. \quad [4]$$

Here, instead of populating the matrix E with $N^2 \times \kappa$ complex exponentials and performing a direct computation of Eq. 2, typically an FFT F ($C^{N^2 \times N^2}$) is performed followed by a resampling procedure of the Cartesian k-space data along the arbitrary k-space waveform using the matrix G (i.e., the inverse gridding matrix). For optimal sinc interpolation, one element in the inverse gridding matrix becomes $G_{l,i}=$ sinc($\tilde{k}_l - k_i$), with $\tilde{k}_l$ and $k_i$ representing the k-space grid locations; these positions, $k_i$, are defined by the arbitrary sampling trajectory. To boost computation efficiency, more compact resampling kernels (eg. Kaiser-Bessel window) are normally used instead of sinc interpolation. The formalism described in Eq. 4 is also know as the inverse gridding operation. From a Cartesian image, inverse gridding is able to generate k-space sample points along an arbitrary trajectory defined by $k_i$; therefore, it represents the inverse operation to conventional gridding reconstruction.

Most frequently, MR data that are sampled along non-Cartesian k-space trajectories are reconstructed using gridding reconstruction; however, Eq. 3 can also be used to form an image from these arbitrarily sampled k-space data. Because of computational complexity, the direct inversion of Eq. 3 to find v is prohibitively inefficient; therefore, a least squares solution for v, $$v = \underset{v'}{\operatorname{argmin}} \|(E^H E)v' - E^H m\|_2, \quad [5]$$

is normally found in an iterative fashion by means of the conjugate gradient method. This approach has recently gained popularity since it provides the foundation for iterative SENSE reconstruction as well as for non-linear phase correction in DWI.

In the next step, we demonstrate how motion impacts the acquired k-space data. Specifically, we assume that motion occurs between interleaves but not during interleaves. This assumption is legitimate for all MR applications for which the positional changes during one interleave are negligible. With $FF^H=I$, where I is the identity matrix, let $\Omega$ be a warping matrix that operates on an unperturbed image $v_0$ that yields the image v and let $\Lambda$ be the transformation rule in k-space that corresponds to $\Omega$ in the image domain so that $$v = \Omega v_0 = F^H \Lambda F v_0. \quad [6]$$

Consequently, in the presence of motion, the signal equation for the acquired MR data changes to $$m = Ev = GFv = GF\Omega v_0 = GFF^H \Lambda F v_0 = G\Lambda F v_0 = E'v_0. \quad [7]$$

Equation 7 clearly demonstrates that the solution of Eq. 4 yields a solution image v that is corrupted by motion. In order to obtain the true image $v_0$, the spatial warping $\Omega$ needs to be included in the encoding matrix E. An augmented version of Eq. 3 that considers spatial transformation is therefore $$(F^H A^H G^H) Dm = (F^H A^H G^H) D(G\Lambda F) v_0, \quad [8]$$

in which the term in the parenthesis on the left-hand side of Eq. 8 reflects the gridding of the acquired data, correction for motion, and inverse FFT. Equation 8 can be solved for $v_0$ following the same scheme as outlined in Eqs. 3 and 5. Here, D ($D_{(\gamma,\kappa),(\gamma,\kappa)} = $k_density$(k_i)^{-1}$) has been introduced in Eq. 8 as a sampling density correction matrix exactly like in Pruessmann's original approach. Also, the rotation of k-space data will affect the sampling density in k-space. Therefore, in this invention the true sampling density was determined by a Voronoi tessellation approach after motion correction was applied to the trajectories. Note, however, the accurate knowledge of the sampling density distribution is not so critical for this estimation problem since the iterative conjugate gradient approach works even without prior knowledge of the sampling density information. Nevertheless, the exclusion of the density matrix causes much slower convergence rates because the density correction acts as a pre-conditioner. Additional preconditioning can be achieved by adding intensity correction.

Despite density correction, severe motion can lead to inconsistencies of k-space data, that is, some areas in k-space are less densely sampled than required by the Nyquist sampling criterion. In other words, depending on the severity of motion, the linear dependency in Eq. 8 increases and, therefore, the conditioning of the system matrix E' decreases, yielding considerable reconstruction artifacts. We hypothesize that parallel imaging helps to ameliorate the conditioning of this matrix system by adding additional encoding information using spatially varying coil sensitivities. Following Pruessmann's seminal work, the k-space data for nc coils can be written as:

$$m' = [m_1 m_2 \ldots m_{nc}]^T = E'v, \quad [9]$$

where $E'_{(i,\gamma)u} = c^\gamma(r_u) \cdot \exp(-jk_i \cdot r_u)$, $c^\gamma(r_u)$ is the complex coil sensitivity of the $\gamma^{th}$ coil at position $r_u$, and $m_1 \ldots m_{nc}$ are the k-space sampling data vectors for each of the nc coils. For each coil, one can combine E with $c^\gamma$ on a per pixel basis using $E \cdot \text{diag}(c^\gamma)$, and v can be estimated based on the aforementioned iterative conjugate gradient method. For reasons of increased processing speed and without loss of generality, E is again replaced by GF. Instead of the conventional gridding and inverse gridding, we used in our implementation the convolution approach introduced by Wajer et al. Alternatively, the FFTW (Fastest Fourier Transform in the West) algorithm could be used for non-power-of-two matrices and non-integer over-sampling factors to speed up the gridding and inverse gridding steps during the conjugate gradient iteration.

Assuming that there is an inverse warping operation (i.e., there exists an matrix $\Omega$inv so that $\Omega\Omega$inv $s_0 = s_0$), our motion correction approach in Eq. 7 can be expanded to incorporate the coil sensitivity information by rewriting the signal equation of the $\gamma^{th}$ coil as $$m_\gamma = GF\text{diag}(c^\gamma)v = GF\text{diag}(c^\gamma)\Omega v_0 = GF\Omega\text{diag}(\Omega_{inv}c^\gamma)v_0$$

$$m_\gamma = GAF\text{diag}(\Omega_{inv}c^\gamma)v_0 = \tilde{E}^\gamma v_0, \quad [10]$$

so that when all coils are combined, Eq. 10 can be expanded to $$m' = \text{diag}(\tilde{E}^\gamma)v_0. \quad [11]$$

In this context, it is important to understand that in the case of patient motion the conventional frame of reference defined by the imaging gradients and the patient frame of reference are not necessarily aligned. Here, the matrices G and F and the vector $c^\gamma$ are all defined in the gradient frame of reference, whereas the final image $v_0$ is given in the patient frame of reference. Specifically, the matrix $\Omega$ transforms voxels from the patient frame into the gradient frame of reference. Notice that from the perspective of the patient frame of reference for each shot, the coil sensitivities do not remain static but, instead, "move around the object". To transfer the "coil motion" into the patient frame, the warping $\Omega_{inv}c^\gamma$ is used. Because we are assuming that the coil elements are static (we are using a rigid 8-channel head array coil) for the rest of this project, it is unnecessary to show that any true coil motion in the gradient frame of reference (theoretically, even without subject motion) can be modeled by including the motion pattern into the warping matrix $\Omega_{inv}$. For example, coil motion relative to the patient might occur in cardiac or abdominal imaging during respiratory excursions. However, for self-calibrated data, such as variable-density spirals (FIG. 4a) or a preceding spiral-IN navigator (FIG. 4b), from which the coil sensitivity information can be extracted for each shot, the spatial warping of coil sensitivities is not required since these sensitivity maps are inherently registered to the trajectories to form the desired image. Here are spin echo interleaved spiral pulse sequence and k-space trajectories used to obtain navigator images. A variable-density spiral design (a-b) can be designed to cover enough information around the center of k-space, so that a low resolution navigator image can be produced. Alternatively, a short (~3-5 ms) single shot spiral-IN trajectory can be used during the initial spin echo formation followed by a conventional interleaved spiral trajectory to form the desired image.

In this invention, we assumed rigid body motion only, which can be modeled by translations and rotations. Specifically, rotations can be applied most efficiently during gridding by applying the appropriate rotation matrix to the initially prescribed k-space trajectory vector, $k' = R_{\phi,\varphi,\xi,n}k$, for each profile/interleave, n, where $$R_{\phi,\varphi,\xi,n} = \begin{pmatrix} 1 & 0 & 0 \\ 0 & \cos\phi_n & \sin\phi_n \\ 0 & -\sin\phi_n & \cos\phi_n \end{pmatrix} \begin{pmatrix} \cos\varphi_n & 0 & -\sin\varphi_n \\ 0 & 1 & 0 \\ -\sin\varphi_n & 0 & \cos\varphi_n \end{pmatrix} \begin{pmatrix} \cos\xi_n & \sin\xi_n & 0 \\ -\sin\xi_n & \cos\xi_n & 0 \\ 0 & 0 & 1 \end{pmatrix} \quad [12]$$

is a 3D rotation around the x, y, and z axes using the angles $\phi$, $\varphi$, and $\xi$, respectively. The direct rotation of the trajectory avoids interpolation errors that would otherwise occur using image (in our case k-space) rotation functions. Also, sub-voxel translational motion, $\delta x = (\delta x\ \delta y\ \delta z)^T$, can be achieved most efficiently by adding corresponding phase ramps in k-space during gridding by phasing the sampled k-space data:

$$m_{Trans}(i) = \quad [13]$$

$$m(i)e^{j2\pi\left(\frac{k_x(i)}{k_{x,max}-k_{x,min}} \cdot \frac{\delta x}{FOV_x} + \frac{k_y(i)}{k_{y,max}-k_{y,min}} \cdot \frac{\delta y}{FOV_y} + \frac{k_z(i)}{k_{z,max}-k_{z,min}} \cdot \frac{\delta z}{FOV_z}\right)}.$$

Theoretically, the order in which rotational and translational motion are applied is irrelevant as long as it follows the order in which these parameters are acquired during the registration process (see next section). For implementation reasons in this work, the rotation was applied first and then followed by the translation.

Determination of Translational and Rotational Motion Components

Figure 4:
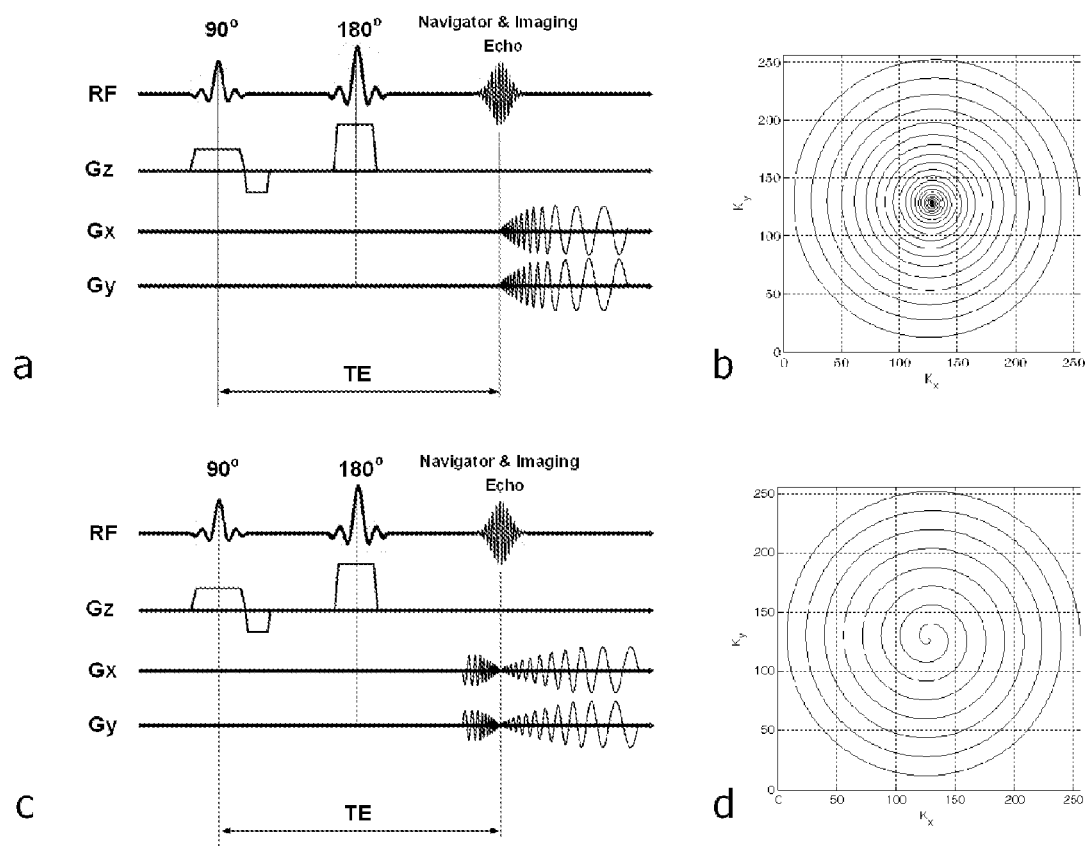
FIG. 4 illustrates spin echo interleaved spiral pulse sequence and k-space trajectories used to obtain navigator images.

The extent of motion can be determined from an appropriate set of navigator images. These navigator images can either be generated by self-navigating trajectories (e.g. variable-density spiral waveforms and PROPELLER blade) (FIGS. 4a-b) or from a separate acquisition (FIGS. 4c-d). Here are Spin echo interleaved spiral pulse sequence and k-space trajectories used to obtain navigator images. A variable-density spiral design (a-b) can be designed to cover enough information around the center of k-space, so that a low resolution navigator image can be produced. Alternatively, a short (~3-5 ms) single shot spiral-IN trajectory can be used during the initial spin echo formation followed by a conventional interleaved spiral trajectory to form the desired image. After obtaining a template by averaging all navigator images, all other images will be co-registered to this reference image by adjusting the amount of rotation and translation to provide the highest degree of similarity between template image and the image to be registered. This process is iterated and for each iteration, a new template is constructed from the counter-rotated and counter-translated navigator images. In this invention, a multi-grid registration approach is used to find the global optimum of the cost function by automatically traversing parameter space (rotation, translation) using the Nelder-Mead algorithm (a.k.a. simplex algorithm). During each iteration step, the source image underwent a rotation and translation. Specifically, the Pearson correlation coefficient $$R = \frac{\sum_{i=1}^{N \times N} A_i B_i - \frac{1}{N^2} \sum_{i=1}^{N \times N} A_i \sum_{i=1}^{N \times N} B_i}{\sqrt{\left(\sum_{i=1}^{N \times N} A_i^2 - \frac{1}{N^2}\left(\sum_{i=1}^{N \times N} A_i\right)^2\right)\left(\sum_{i=1}^{N \times N} B_i^2 - \frac{1}{N^2}\left(\sum_{i=1}^{N \times N} B_i\right)^2\right)}} \quad [14]$$

is computed from the resulting magnitude image, A, and the target magnitude image, B, over all pixels, i=1 . . . N×N, to serve as a similarity measure. Here, the multi-grid approach reduces the likelihood of the optimizer being trapped in a local optimum. A nice feature of many registration approaches, including the one used in this invention, is the ability to co-register images in the subpixel range. Thus, the detection of motion much smaller than the size of the navigator voxels is possible.

Computer Simulation

All simulations and post-processing steps were performed on a Laptop PC (IBM T43p, Pentium M, 2.13 GHz, 1 GB RAM) running IDL 6.3 (RSI, Boulder, Colo.). The synthetic scan data for an interleaved spiral and EPI acquisition (32 interleaves) were generated by using inverse gridding operations on MR images of a quality phantom (FOV=22 cm). First, to simulate rigid body motion, the same number of synthetic images as interleaves (i.e., n=32) were generated, differing only in random object rotation (range ±30°) and translation (range ±15 mm). These were generated by using IDL's built-in image rotation function rot and a Fourier-domain based continuous image shift operation. Here, the IDL rot function uses a bicubic convolution method to resample the rotated voxel on the Cartesian grid. Second, each of these n images was then multiplied by eight simulated receiver coil sensitivities that were assumed to be located around the circumference of the object and did not move. The coil sensitivity information was generated using the Bio-Savart law. These 256 images were then zero-padded by a factor of two and underwent 2D-FFT. Thereafter, artificial k-space data were generated by inverse gridding operations to create interleaved spiral and EPI k-space trajectory data. On a per coil basis, one interleaf was taken from each of the n individually distorted images to create a single, motion-corrupted k-space data set that was used for testing the proposed correction approach.

To assess the degree of effective image artifacts in an uncorrected scan, the aforementioned motion-corrupted data set was gridded to Cartesian k-space, using the k-space trajectories as they were initially prescribed. Thereafter, the correction for rotation and translation was applied to the simulated, motion-corrupted k-space data and reconstructed using either conventional gridding reconstruction or our new parallel imaging based approach. In order to avoid any bias from inaccuracies of the navigator image co-registration, the rotation and translation parameters that were used to generate the corrupted data were inputted in our motion correction scheme. As outlined in the previous section, inconsistencies in k-space resulting from the rotation and translation correction were removed by means of augmented iterative SENSE reconstruction. The normalized absolute squared difference between the original quality phantom image and either the conventionally gridded, motion-corrupted image or the SENSE reconstructed image was computed and served as a surrogate measure to determine the efficacy of the accomplished artifact correction. In addition, other commonly used metrics, such as normalized mutual information and normalized entropy, were used to assess the agreement between images. In contrast to absolute squared differences or normalized entropy, which decreases with increasing co-registration between images, both image correlation and normalized mutual information increases with increasing co-registration between images.

The registration precision is very important for the efficacy of our correction method. It determines how much the rotation and translation parameters that have been measured will fluctuate and, thus, by how much positional "jitter" the k-space trajectories (and sensitivity maps) are burdened. The latter causes ghosting artifacts and adds unwanted blurring to the final image. Registration accuracy, on the other hand, leads to an overall mismatch between the registered, motion-corrected image and the true position, but will not cause any of the aforementioned image artifacts caused by the jitter. To estimate the dependence of registration accuracy and precision as a function of navigator resolution ($16^2$, $24^2$, $32^2$, $48^2$, and $64^2$), spiral-IN navigator images (for details see next section) were rotated as well as translated along the x and y dimensions in small increments. A total number of 200 equidistantly spaced increments were picked spanning a range of ±15° for rotation and ±10 mm for translation over a FOV of 240 mm. The original navigator image, free of any rotation or translation, served as a reference image. Rice-Nakagami-distributed noise was added to all images, so that the navigator SNR was 5, 10, or 15. Thereafter, each translated and rotated image was co-registered independently to the reference image using the registration method outlined in the Theory section. The observed motion parameters were compared to the true motion applied by linear regression. Here, the correlation coefficient and the standard deviation of the observed rotation and translation from the regression line served as surrogates for accuracy and precision of our registration method.

MR Experiments

Axial 2D spin echo scans in two volunteers were acquired on a 1.5T whole-body system (Signa CVi, GE, Milwaukee, Wis.) with a high performance gradient set (maximum gradient strength of 50 mT/m, maximum slew rate of 150 mT/m/s), using a new, self-navigated spiral imaging sequence. MR signal reception was accomplished using a rigid 8-channel head array coil (MRI Devices, Milwaukee, Wis.), whereas signal excitation was performed with the integrated body coil. All human studies performed were approved by the review board of our institution. Informed written consent was obtained from each participating subject after the nature of the study was fully explained and understood.

The scan parameters for the spin echo spiral scans were as follows: TR/TE=4,000 ms/56 ms or 85 ms, slice thickness/gap=5/0 mm, 12 slices, FOV=24 cm, matrix=256, interleaves=32, NEX=1, and a receiver bandwidth of +/−125 kHz. The self-navigated spiral sequence uses a low-resolution, fully sampled spiral-IN readout (24 cm FOV) prior to the formation of the spin echo (FIGS. 3c-d) to generate a navigator image. This was followed by a standard interleaved spiral-OUT acquisition for high resolution imaging. Using the same acquisition parameter, navigated gradient echo spiral images were also acquired with the same sequence by turning of the refocusing RF pulse and using a TR/TE of 4,000 ms/12 ms and 90 ms. All spiral trajectories were initially slew-rate limited and then gradient limited.

The spiral-IN navigator was a 3.5 ms single-shot spiral that covered an inner k-space radius of 32 points sampled above the Nyquist rate. The first interleaf of the acquisition had a 1 ms longer echo time than the remaining acquisitions. Combining this first navigator image with all subsequent matching navigator images allowed the generation of a field map to demodulate data during the gridding process. Synchronization delays between gradient waveform output and data acquisition that could lead to rotations between the spiral-IN and spiral-OUT image were measured and adjusted if necessary at the beginning of each study.

During the experiment, the volunteers were either asked to not move at all or to rotate their heads at two levels of motion: a rotation of +/−10°, which was deemed mild motion, or a rotation of +/−20°, which was deemed moderate motion. The relatively large motion was chosen to reflect the range of motion we see in uncooperative patients at our institution, such as stroke patients or unsedated pediatric patients. Thereafter, further experiments with smaller motion +/−5° and +/−5 mm were also conducted.

After raw data acquisition, the navigator images were first reconstructed and corrected for receiver coil inhomogeneities using the coil sensitivities of the individual receiver coil elements (using the sum-of-squares image as a reference). The coil sensitivity information was directly retrieved from the navigator images and was then filtered and extrapolated as described elsewhere. Thereafter, the amount of motion relative to the time-average of all navigator images was determined by co-registration as outlined in the Theory section. An average of all navigator images was used because it provides better SNR and greater registration robustness than a single navigator image; the use of an average template has already demonstrated great utility for the correction of eddy current distortions in DTI. After all images were registered to the average image, a new average image was computed and the registration of the original data to the new template was repeated. Here, the convergence of the algorithm was obvious by the diminishing blur seen in the average image. Typically, no more than three iterations are required until the blurring is no longer noticeable. Ultimately, the acquired k-space data were corrected for translational and rotational motion and underwent the SENSE reconstruction as outlined previously.

Figure 5:
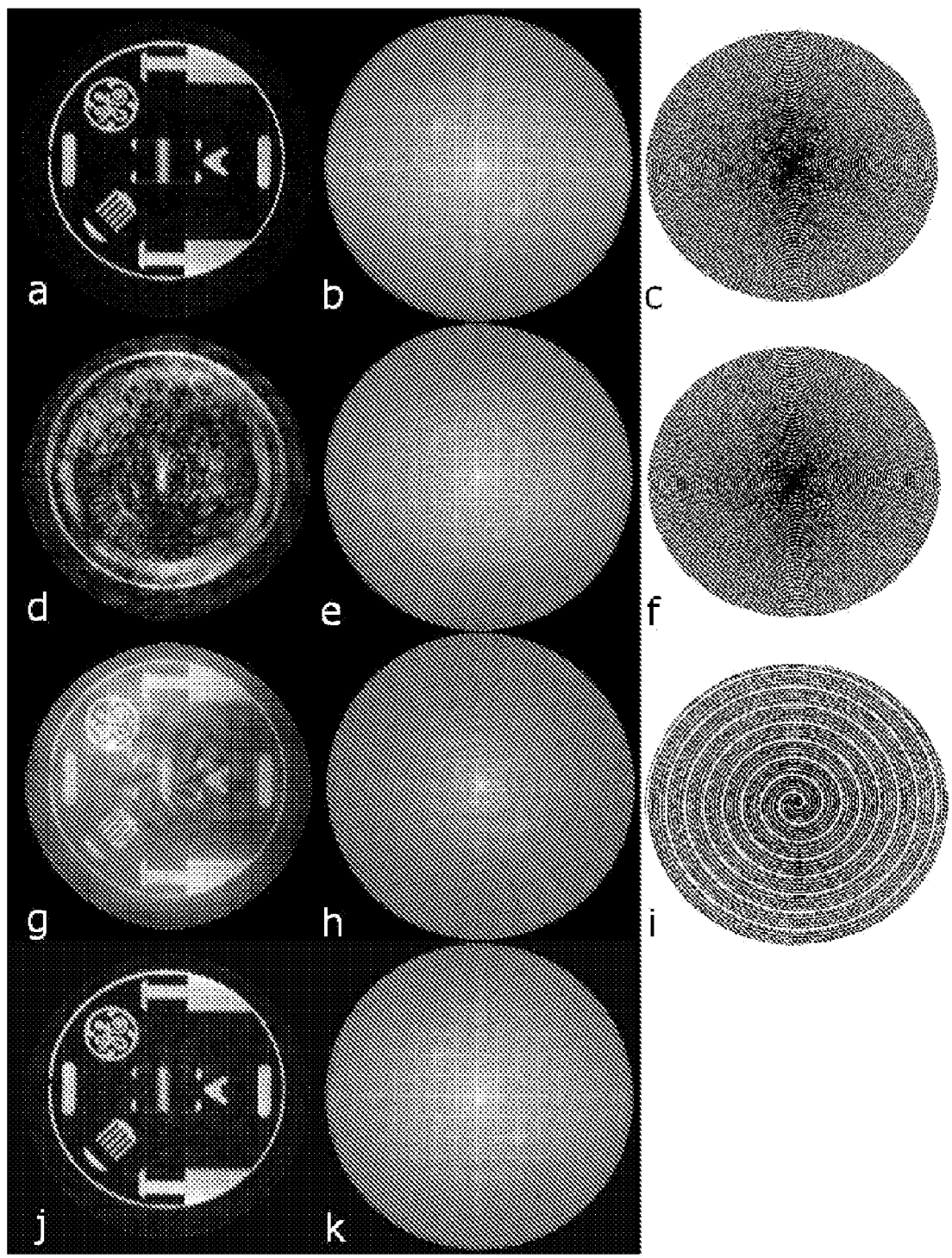
FIG. 5 illustrates assessment of the effect of object rotation during an interleaved spiral data acquisition (32 interleaves) simulated in a quality phantom.
Figure 6:
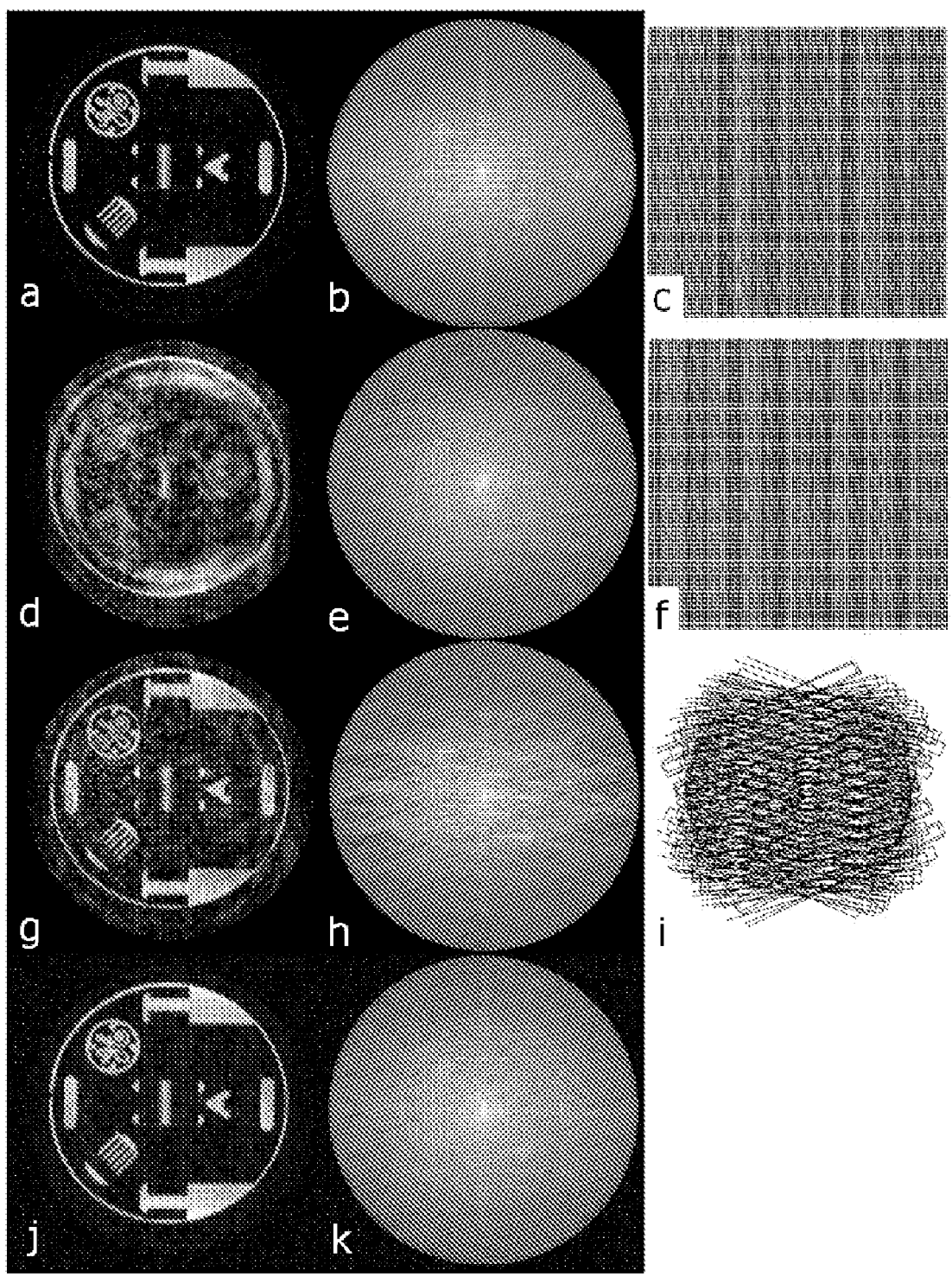
FIG. 6 illustrates assessment of the effect of object rotation during an interleaved EPI acquisition (32 interleaves) simulated in a quality phantom.

Computer Simulation—FIG. 5 shows the effects of rotational and translational motion during an 32-interleave spiral acquisition. Here, assessment of the effect of object rotation during an interleaved spiral data acquisition (32 interleaves) simulated in a quality phantom. Eight receiver coils are distributed equally around the circumference of the phantom. For each interleave, a random object rotation within the range of ±30° and a random object translation within the range of ±15 mm was introduced with the following results: a) gridding reconstruction of a quality phantom without rotation; b) gridded k-space data; and c) spiral sampling trajectory. Note that for better visualization of the sampling trajectory only the region ±kmax/4 is plotted. If the acquired data are gridded according to the prescribed trajectory (c and f), inconsistencies in k-space (e) cause severe artifacts in the reconstructed image (d). Some of these distortions can be reduced (g) if one uses the object rotation to counter-rotate the k-space acquisition trajectory for that particular interleaf (i) and uses these corrected orientations for gridding (h). Correction for altered sensitivity and an iterative SENSE reconstruction (10 iterations) can remove most of the residual k-space sampling errors (k) and provides an image almost free of artifacts (j). If the data are gridded along the desired spiral waveform without correction prior to gridding, significant artifacts become apparent in the image (FIG. 5d). After correcting for rotational and translational motion, the image quality could be improved (FIG. 5g), but considerable variations in k-space sampling density and regional under-sampling (FIGS. 5h and i) still led to noticeable artifacts. After 10 iterations using the augmented SENSE algorithm, the artifacts were barely noticeable in the final reconstruction (FIG. 5j). The efficacy of this method for removing k-space inconsistencies can also be seen in FIG. 5 of the final k-space, which has a more homogeneous appearance overall. FIG. 6 provides similar evidence for improved image quality after the application of the correction scheme in a simulated interleaved EPI acquisition. However, it is apparent from both the k-space data and the final SENSE reconstruction that interleaved spirals (FIG. 5) have slightly less artifacts than interleaved EPI scans (FIG. 6). This originates from the sparser coverage of the outer portion of interleaved EPI k-space after rotation correction and the inherent rotational symmetry of spiral trajectories. The degree of mismatch between the original image and the motion corrupted data with and without correction was quantified by three different similarity measures and is summarized in Table 1. The similarity measures reported in Table 1 confirm the visual impression of significant artifact reduction after the application of the parallel imaging-based motion correction algorithm; in the presence of motion, the image obtained from conventional gridding reconstruction has the least similarity with the reference image. Gridding with motion correction and, even more so, iterative SENSE with motion correction increases the similarity between the image obtained under motion and the reference image.

Table 2 summarizes the results of our experiment assessing the influence of navigator resolution on the accuracy and precision of our registration procedure. Even with the smallest navigator resolution, the simulated motions were captured very well, which is also reflected by the high correlation coefficient, R. The fluctuation of the positional changes that were determined by the registration procedure and that are reflected by the standard deviation, $\sigma$, of the differences between the detected rotations and translations and the corresponding regression line, was clearly in the submillimeter range. With increasing navigator resolution and increasing SNR, this fluctuation diminished further.

MRI Studies

Figure 7:
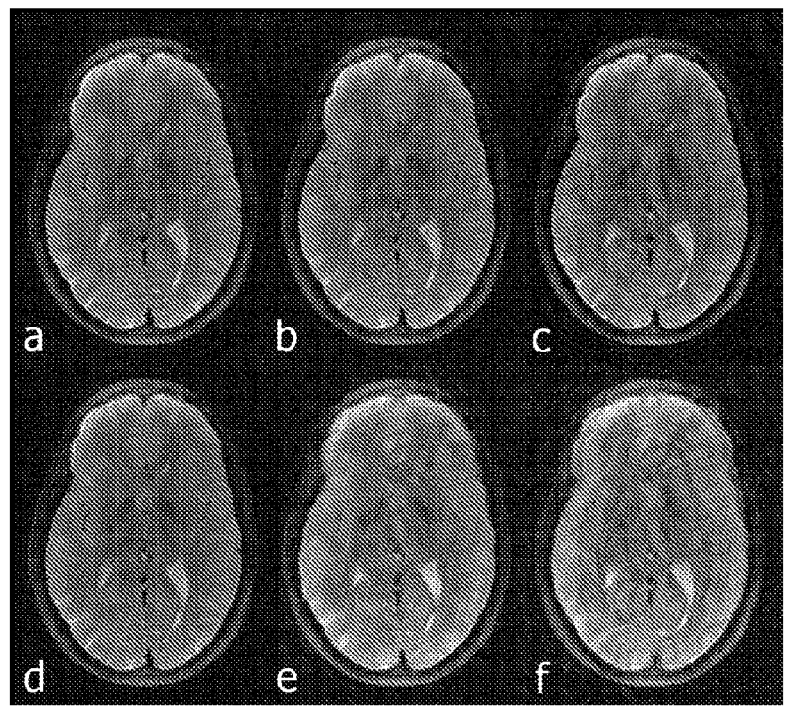
FIG. 7 illustrates in vivo experiment conducted with a fully sampled low-resolution (32×32) single-shot spiral-in navigator preceding each conventional spiral interleave.

FIG. 7 shows the new navigated interleaved spin echo spiral-OUT images obtained in a volunteer who was asked either to lie still or perform random mild or moderate head movements during the acquisition of navigated interleaved spiral scans. Here, in vivo experiment conducted with a fully sampled low-resolution (32×32) single-shot spiral-IN navigator preceding each conventional spiral interleave. a)-c) are motion corrected spin echo T2w interleaved spiral-OUT scans with no motion (a); mild motion (b); and moderate motion (c). d)-f) are the resulting images reconstructed from the same data (i.e., no motion (a); mild motion (b); and moderate motion (c)) without any motion correction applied. Without correction, even mild motion (e) causes significant artifacts that are mostly apparent in the frontal brain. This is because the origin of the rotation axis is located occipitally. (f) Increased image artifacts can be seen for moderate motion. Without motion, there are no apparent differences between the reconstruction performed with (a) and without (d) motion correction. However, obvious artifact reduction can be achieved with the parallel imaging based correction scheme in cases of both mild (b) vs. (e) and moderate (c) vs. (f) motion. With moderate motion (c) some residual artifacts are apparent due to the severity of motion. The images in FIG. 7 demonstrate significant motion artifacts when no motion correction was applied. In particular, the image artifacts become increasingly worse and non-diagnostic with increasing levels of motion. In comparison, the correction algorithm was clearly able to reduce the artifact level and diminish the motion-induced blurring. As required, the application of navigator registration and subsequent motion correction to data sets without apparent motion did not lead to any visual changes in image quality or to significant quantitative differences that could be captured by either one of the three similarity measures. For the case of small motion, the quantification of image mismatch between the static and the moving brain with and without correction is summarized in Table 3.

Figure 8:
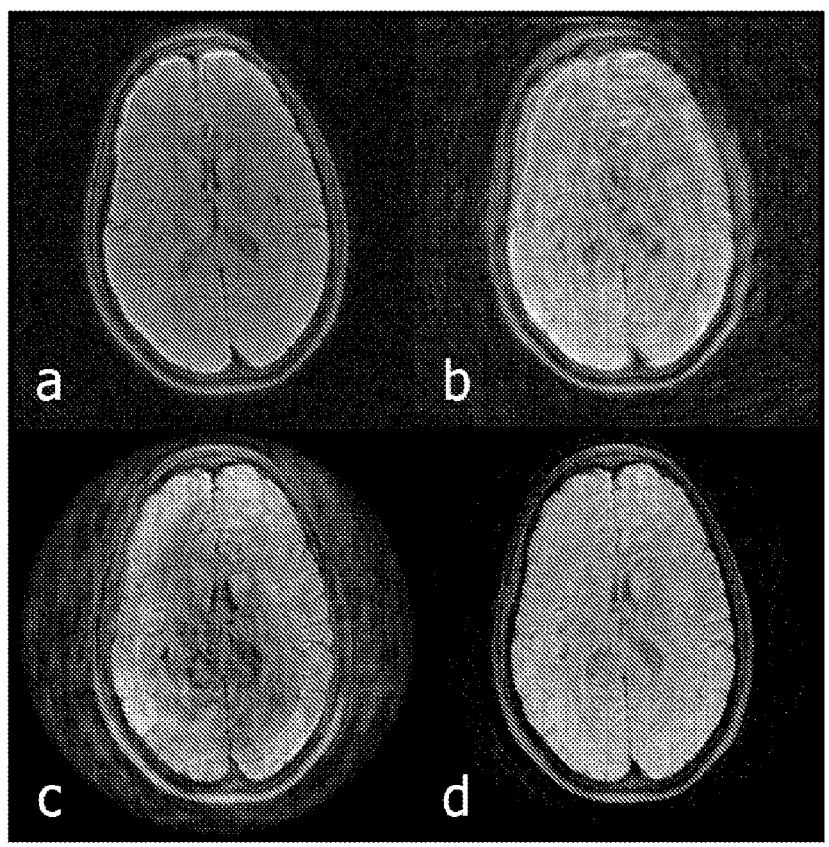
FIG. 8 illustrates another in vivo experiment conducted with a fully sampled low-resolution (32×32) single-shot spiral-in navigator preceding each conventional spiral interleave.

FIG. 8 shows further examples of navigated gradient echo-based interleaved spiral-OUT images from another volunteer. Here, In vivo experiment conducted with a fully sampled low-resolution (32×32) single-shot spiral-IN navigator preceding each interleave of a gradient echo-based interleaved spiral-OUT scan with a) TE=12 ms and b) TE=90 ms. Top left: the reference sum-of-squares interleaved spiral image is acquired with no subject motion. Top right: Significant artifacts are apparent if the volunteer performs moderate head motion during data acquisition and if no motion correction is applied. Bottom left: correction of k-space data for translational and rotation motion results in sharper object contours, but the image quality is still corrupted by residual ghosting from local undersampling and sampling density variations. Bottom right: improved image quality after the application of the augmented SENSE reconstruction, especially for the TE=90 ms case (FIG. 8b) the SENSE-reconstructed image shows less artifacts than the conventionally reconstructed (i.e. gridding reconstruction) image with supposedly no motion. Due to the intentional head movements of the volunteer, considerable k-space sampling density variations occurred, which led to significant artifacts in the conventional image reconstruction. These artifacts are predominantly visible around the frontal aspect of the brain because lying in the coil positions the axis of rotation at the back of the head. Equal windowing was chosen for all images to better reveal reduction of ghost artifacts. The amount of head rotation and translation was estimated from the navigator images. Correcting the k-space data only for rotational and translational effects clearly reduced image blurring, but the resulting k-space fragmentation led to considerable aliasing artifacts. With the application of the SENSE-based correction scheme, these aliasing artifacts were suppressed quite well. In FIG. 7b, the motion corrected image using the parallel imaging method appears to be of better quality than the image with supposedly no motion. Despite being asked to remain still, the volunteer moved slightly during the course of the data acquisition. Therefore, this image is a good example of how our method performs with a small amount of movement, although we did not test this range of motion systematically.

Figure 9:
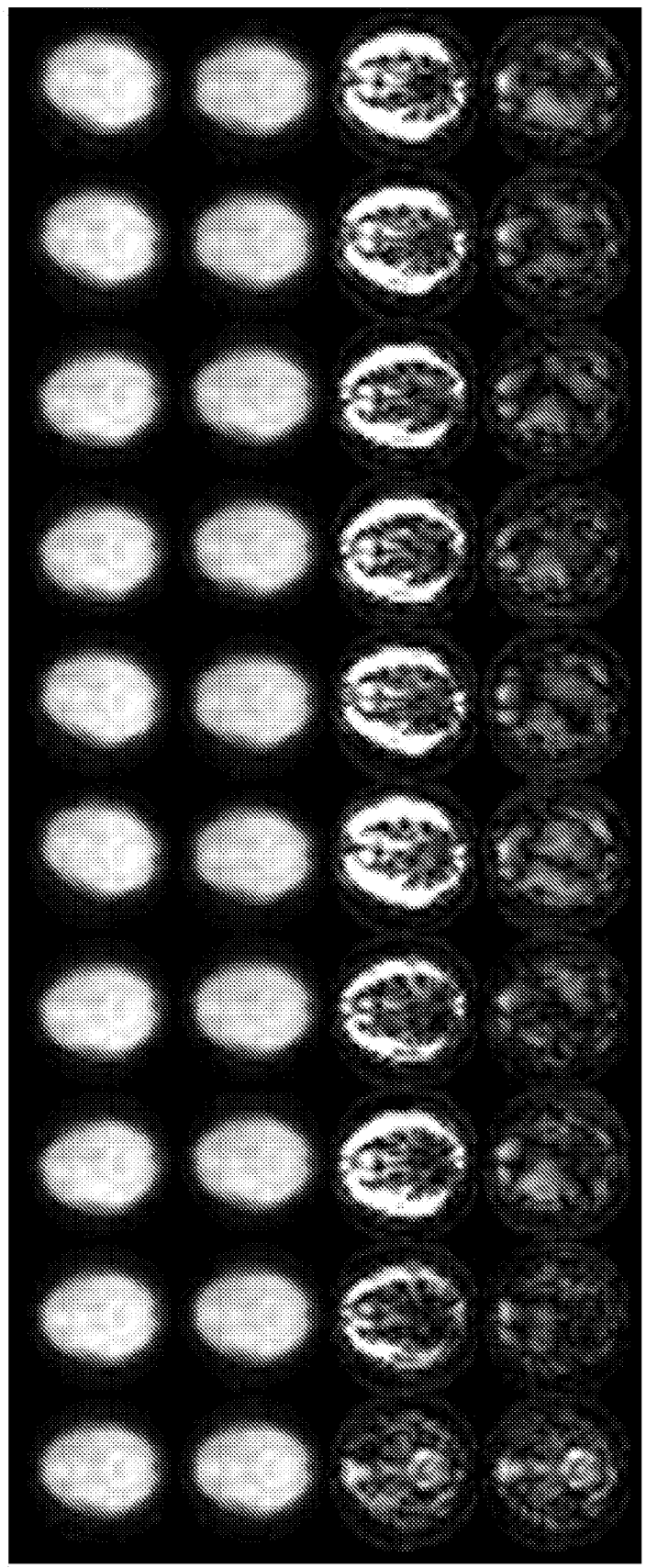
FIG. 9 illustrates ten out of thirty-two navigator images obtained from consecutive acquisitions (32 interleaves).

Finally, FIG. 9 demonstrates an example of the efficacy of the registration algorithm that provided us with the amount of rotation and translation that had to be applied to each individual interleaf. Here, Ten out of thirty-two navigator images obtained from consecutive acquisitions (32 interleaves). Top row: navigator images before co-registration. Second row: aligned navigator images after registration of each image to an average image computed from all 32 navigators. Third row: absolute squared difference images between the individual navigator images before registration and the reference image. Spatial misregistration is clearly apparent from the hyper-intense rim at the edge of the brain. The intensity scaling is increased 10 times compared to the two rows to better highlight differences. Bottom row: absolute squared difference images between the individual navigator images after registration and the reference image clearly demonstrate a better alignment. The scaling is identical with the images in the 3rd row. Any spatial misregistration is typically reflected in the difference images (i.e., navigator images or reference image) by a hyper-intense rim around the edge of the brain or other structures, with rapid contrast gradients. As expected, after the application of the registration algorithm, this rim was not apparent in the difference images. Occasionally, we found that certain image frames demonstrated global hyper-intensities despite successful co-registration. This is most likely due to through-plane motion. Here, spins that are either partially saturated or fully relaxed enter the slice and change the overall signal intensity within the section. These spin history effects can also lead to baseline intensity changes of a particular interleave and are, therefore, potentially responsible for residual artifacts. This is a known problem for 2D retrospective motion correction schemes and is independent from the method proposed herein. In the current implementation, no measures were taken to account for this confounder; however, in the case of redundant sampling, it has been suggested that data sets with significant spin history problems should be rejected.

Patient motion can significantly reduce the diagnostic quality of MR studies. Often the condition of the patient precludes them from being cooperative or from remaining still for the duration of the exam. This is especially true for longer examination periods in which the likelihood for patients to become uncomfortable and begin to move increases as the scan progresses. This, in turn, can require repeated exams and lead to overly prolonged studies. In the pediatric setting, often sedation or anesthesia is needed to avoid motion artifacts, leading to increased logistic problems and higher exam costs. It is therefore of great relevance to reduce the degree of motion artifacts in MRI scans. In the past several years, several attempts have been made to minimize artifacts from patient motion. These correction approaches have been carried out either prospectively or retrospectively.

In this invention, a variant of parallel imaging reconstruction for arbitrary k-space acquisitions has been proposed that allows for efficient retrospective in-plane motion correction. An excellent review of the potential of parallel imaging to correct for motion has been presented recently by Larkman et al. The work here has some resemblance to the work of Atkinson et al, Batchelor et al, and Pipe et al. The novelty of this work is i) a framework for motion correction that can be applied to arbitrarily sampled k-space data; ii) the capacity to overcome local k-space under-sampling and different sampling densities by improving the conditioning of the inverse problem by means of additional spatial encoding information from coil sensitivities; iii) a rapid translation correction by the proper phasing of each k-space sample point and rotation correction by applying a rotation matrix to each k-space vector k(ti) that is part of the gridding step; and iv) the extraction of motion information from either a navigator scheme built into the trajectory itself or an additional navigator image. This new method relies heavily on the pioneering work of Pruessmann et al and Kannengiesser et al regarding the fast reconstruction of under-sampled, non-Cartesian k-space data. Potential future developments include finding alternative ways to reconstruct the data by synthesizing missing k-space parts using information from adjacent points in k-space, such as GRAPPA-based methods.

A comparative evaluation of image quality for motion-corrupted data prior to and after correction for rigid body motion was performed both in vivo and using computer simulations. The rigid body motion correction proposed in this effort (i.e., correcting k-space data for rotation and translation) with conventional gridding reconstruction was able to reduce artifacts to some extent, although considerable residual artifacts were still apparent due primarily to local violation of the Nyquist sampling criterion in k-space. By virtue of an augmented iterative parallel imaging reconstruction, the level of residual artifacts was significantly reduced. The amount of motion simulated in this embodiment was fairly large (±30° rotation and ±15 mm translation), but was selected to cover the typical amounts of motion encountered in clinical studies.

Exact knowledge of the rotation and translation components is crucial for any motion correction scheme to be able to fully correct image artifacts. Like many other correction schemes, the efficacy of our method strongly depends on the ability of the navigator image and the co-registration technique to pick up on small amounts of motion in vivo. However, for the navigated interleaved spiral trajectories that we have tested in vivo, the small residual motion errors did not cause any significant residual artifacts. If the residual motion error increases, mismatch will first be noticeable as a slight blurring in the corrected image and/or by "swirl artifacts." Conversely, the great advantage of low resolution navigator images is that the co-registration is much more robust, (i.e., the parameter search does not get so easily trapped into the local optima of the cost function, and the smaller image size allows very rapid registration). In assessing the influence of navigator resolution to the registration quality, it was found that the fluctuations resulting from the registration were in the submillimeter range. A potential difficulty for the registration step could be the variable coil sensitivity modulation that affects the image intensity. These additional signal intensity modulations might reduce the effectiveness of traditional similarity measures, and this effect needs to be investigated further. To minimize this confounder, the navigators were first intensity corrected. In the future, similarity measures that are known to be more insensitive to differences in image contrast, such as (normalized) mutual information, might be more suitable than the Pearson correlation coefficient. However, in this embodiment, no influence from the choice of similarity measure on the registration could be noticed, regardless of whether Pearson correlation or normalized mutual-information was used.

The motion correction scheme presented here can also be used in conjunction with parallel imaging for scan acceleration. There is essentially no difference in under-sampled k-space resulting from conventional parallel imaging or from local sampling density variations caused by reorganizing k-space as a result of motion correction. The degree to which aliasing can be avoided is determined by the amount of net regional under-sampling in k-space. In other words, with increasing data reduction as a result of parallel imaging, the method's ability to correct for motion diminishes, whereas if one wants to put more emphasis on reducing severe motion, the parallel imaging reduction factor has to be derated accordingly. The ability of the reconstruction ultimately depends on the number of coils, the geometry factor, and the general conditioning of the design matrix.

One of the shortcomings of the method proposed here is its inability to correct for through-plane motion. We have found that spin history effects can reduce the quality of the reconstruction, although the final outcome is still significantly better than without any correction. Ultimately, spin history effects will always challenge 2D acquisition techniques that are exposed to potential movement with higher degrees of motional freedom. Nevertheless, in this work the goal was to investigate the possibility of correcting motion and spatio-temporal coil sensitivity variations using an augmented generalized parallel imaging reconstruction method. This method, in its general form, is expressed as a three-dimensional problem with six degrees of freedom. The application of this technique to 3D acquisitions should also improve the quality of 3D scans, but further work on retrieving 3D motion information in a rapid fashion is warranted. It is important to note, that even with prospective motion correction and regardless of whether Cartesian or arbitrary k-space acquisitions are used, the modifications to the original sensitivity information (i.e., translation and rotation) are required since the patient is exposed to different coil sensitivities during the course of motion. Therefore, conventional Cartesian parallel imaging algorithms or standard iterative SENSE algorithms do not work properly even when the scan plane can follow the movement of the object.

Although the navigator image technique was initially demonstrated in this invention by using a spin echo approach, we also applied the navigator scheme to regular gradient echo scans. The limitation is that the minimum echo time for the pulse sequence is delayed by a few milliseconds to accommodate the short spiral-in navigator image. If needed and if T2*-decay permits, the navigator signal could also be acquired at the end of the spiral-OUT train (i.e., after the interleaf is acquired that contributes to the high-resolution image). For spin echoes the spiral-IN navigator is particularly useful because it takes advantage of the high SNR available as the signal increases prior to the spin echo formation. As shown in FIGS. 4a and b, a variable-density spiral-out scan could be used as well. The image quality of variable-density spiral scans is affected somewhat more by off-resonance effects and signal decay than conventional, constant-pitch spirals, and it depends on the pitch-factor and overall readout length. Nevertheless, this trajectory has great potential because of its inherent navigation capabilities and is a viable alternative that has been used successfully for self-navigated diffusion-tensor MRI. Due to the spiral readout the overall image quality of our sequence is slightly impaired by the T2* decay during the readout, but could be easily improved by increasing the number of interleaves. The spiral-IN navigator and the parallel imaging based correction scheme can be also combined with conventional FSE readouts.

In summary, a new motion correction scheme and a pulse sequence that takes advantage of the navigator image technique. Our motion correction scheme capitalizes on the ability of parallel imaging methods to correct for missing data in k-space. The amount of motion-induced image displacement and rotation is determined by the means of registration algorithms applied to navigator images and can be included in the iterative parallel imaging reconstruction. An appropriate navigator image can be produced with either a variable-density spiral waveform or an additional, low-resolution, single-shot spiral scan prior to regular image formation.

While the invention has been described with reference to specific embodiments, the description is illustrative of the invention and is not to be construed as limiting the invention. Various applications and modifications may occur to those skilled in the art without departing from the spirit and scope of the invention as defined by the appended claims.

TABLE 1

Amount of mismatch between reference image and distorted (simulated) image assessed by similarity measures.

| | | Normalized squared difference | | | normalized entropy | | | normalized mutual information | | |
|---|---|---|---|---|---|---|---|---|---|---|
| | | uncorrected | trajectory corrected | GSENSE corrected | uncorrected | trajectory corrected | GSENSE corrected | uncorrected | trajectory corrected | GSENSE corrected |
| EPI | rotation | 98.74 | 380.68 | 9.35 | 0.3485 | 0.3793 | 0.2955 | 1.1287 | 1.1359 | 1.1853 |
| | translation | 138.19 | 498.20 | 5.79 | 0.3939 | 0.4247 | 0.2799 | 1.1181 | 1.1392 | 1.2198 |
| | combined | 226.57 | 384.12 | 8.85 | 0.4062 | 0.4118 | 0.3082 | 1.1079 | 1.1358 | 1.1933 |
| spiral | rotation | 119.84 | 52.01 | 11.13 | 0.3546 | 0.3409 | 0.2990 | 1.1318 | 1.1512 | 1.1784 |
| | translation | 157.00 | 19.42 | 5.90 | 0.3889 | 0.3087 | 0.2802 | 1.1222 | 1.1714 | 1.2227 |
| | combined | 232.42 | 71.20 | 15.50 | 0.4000 | 0.3793 | 0.3317 | 1.1097 | 1.1405 | 1.1779 |

TABLE 2

Correlation between Simulated and Estimated Rotations and Translations.

| | | | navres = 16 | navres = 24 | navres = 32 | navres = 48 | navres = 64 |
|---|---|---|---|---|---|---|---|
| x | SNR = 5 | R | 0.999433 | 0.999595 | 0.999795 | 0.999905 | 0.999927 |
| | | $\sigma^1$ | 0.177930 | 0.154053 | 0.112422 | 0.0781978 | 0.0692372 |
| | SNR = 10 | R | 0.999692 | 0.999822 | 0.999896 | 0.999952 | 0.999970 |
| | | $\sigma^1$ | 0.130823 | 0.102574 | 0.0799846 | 0.0552070 | 0.0445193 |
| | SNR = 15 | R | 0.999782 | 0.999841 | 0.999925 | 0.999961 | 0.999976 |
| | | $\sigma^1$ | 0.110199 | 0.0968776 | 0.0680726 | 0.0498330 | 0.0397912 |
| y | SNR = 5 | R | 0.999546 | 0.999758 | 0.999830 | 0.999923 | 0.999959 |
| | | $\sigma^1$ | 0.162598 | 0.121137 | 0.102916 | 0.0704131 | 0.0519895 |
| | SNR = 10 | R | 0.999747 | 0.999881 | 0.999931 | 0.999966 | 0.999977 |
| | | $\sigma^1$ | 0.122041 | 0.0847798 | 0.0654645 | 0.0465636 | 0.0388907 |
| | SNR = 15 | R | 0.999802 | 0.999910 | 0.999948 | 0.999976 | 0.999982 |
| | | $\sigma^1$ | 0.107670 | 0.0738078 | 0.0566544 | 0.0392259 | 0.0341824 |
| $\phi$ | SNR = 5 | R | 0.998987 | 0.999643 | 0.999842 | 0.999938 | 0.999954 |
| | | $\sigma^2$ | 0.344842 | 0.220522 | 0.150436 | 0.0958053 | 0.0822952 |
| | SNR = 10 | R | 0.999294 | 0.999770 | 0.999917 | 0.999966 | 0.999979 |
| | | $\sigma^2$ | 0.289213 | 0.176899 | 0.109040 | 0.0711539 | 0.0554753 |
| | SNR = 15 | R | 0.999349 | 0.999807 | 0.999925 | 0.999968 | 0.999984 |
| | | $\sigma^2$ | 0.277557 | 0.162262 | 0.103673 | 0.0684389 | 0.0485496 |

[1] standard deviation of differences (measured - regression) of translation in mm
[2] standard deviation of differences (measured - regression) of rotation in degrees

TABLE 3

Amount of mismatch between reference image and distorted image assessed by similarity measures.

| | normalized squared difference | | | normalized entropy | | | normalized mutual information | | |
|---|---|---|---|---|---|---|---|---|---|
| Motion | uncorrected | trajectory corrected | GSENSE corrected | uncorrected | trajectory corrected | GSENSE corrected | uncorrected | trajectory corrected | GSENSE corrected |
| Mild | 3.30 | 3.48 | 2.55 | 0.4085 | 0.4075 | 0.3979 | 1.1354 | 1.1147 | 1.1397 |
| Moderate | 5.33 | 3.53 | 2.36 | 0.4162 | 0.4087 | 0.3972 | 1.1252 | 1.1179 | 1.1414 |

What is claimed is:

1. A method of correcting for motion in magnetic resonance images of an object detected by a plurality of signal receiver coils comprising the steps of:
 a) acquiring a plurality of image signals with the plurality of receiver coils,
 b) determining motion between sequential image signals relative to a reference,
 c) applying rotation and translation to image signals to align image signals with the reference,
 d) determining altered coil sensitivities due to object movement during image signal acquisition, and
 e) employing parallel imaging reconstruction of the rotated and translated image signals using the altered coil sensitivities.

2. The method of claim 1 wherein in step c) the rotation and translation to image signals is performed iteratively in image space and in k-space.

3. The method of claim 2 wherein in step a) image signals are acquired using a spiral in/spiral out pulse sequence.

4. The method of claim 3 wherein in step a) the spiral in sequence provides a navigator signal for a k-space acquired signal in the spiral out sequence.

5. The method of claim 4 wherein step e) employs an iterative image reconstruction algorithm using parallel processing.

6. The method of claim 5 wherein the image reconstruction algorithm is iterative SENSE algorithm.

* * * * *